(12) United States Patent
Ryo et al.

(10) Patent No.: US 8,492,912 B2
(45) Date of Patent: Jul. 23, 2013

(54) LIGHT EMITTING DIODE PACKAGE

(75) Inventors: Geun Chang Ryo, Gyunggi-do (KR); Jae Chul Ro, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 286 days.

(21) Appl. No.: 12/618,300

(22) Filed: Nov. 13, 2009

(65) Prior Publication Data
US 2010/0270576 A1 Oct. 28, 2010

(30) Foreign Application Priority Data

Apr. 23, 2009 (KR) .................. 10-2009-0035703

(51) Int. Cl.
*H01L 33/00* (2010.01)
*H01L 23/544* (2006.01)

(52) U.S. Cl.
USPC ...... 257/797; 257/99; 257/676; 257/E33.058; 257/E33.066; 257/E23.179

(58) Field of Classification Search
USPC ............ 257/99, 676, 797, E33.058, E33.066, 257/E23.179
See application file for complete search history.

(56) References Cited

U.S. PATENT DOCUMENTS

| 6,256,437 | B1 | 7/2001 | Sakushima et al. | |
|---|---|---|---|---|
| 2004/0217369 | A1* | 11/2004 | Nitta et al. | 257/99 |
| 2006/0267040 | A1 | 11/2006 | Baek et al. | |
| 2007/0029456 | A1 | 2/2007 | Han et al. | |

FOREIGN PATENT DOCUMENTS

| JP | 63-152256 U | 10/1988 |
|---|---|---|
| JP | 10-229151 | 8/1998 |
| JP | 11-109184 A | 4/1999 |
| JP | 2006-294982 A | 10/2006 |
| JP | 2006-339640 A | 12/2006 |
| JP | 2008-235764 A | 10/2008 |
| JP | 2009-081225 A | 4/2009 |
| KR | 10-0632002 B1 | 9/2006 |
| KR | 10-2008-0041794 A | 5/2008 |
| KR | 1020080041794 | * 5/2008 |
| KR | 10-2008-0069047 A | 7/2008 |

OTHER PUBLICATIONS

Korean Office Action, with English translation, issued in Korean Patent Application No. 10-2009-0035703, mailed Nov. 17, 2010.
Japanese Office Action, w/ English translation thereof, issued in Japanese Patent Application No. 2009-265667, dated Oct. 4, 2011.
Japanese Office Action, and English translation thereof, issued in Japanese Patent Application No. 2009-265667 dated Mar. 6, 2012.
Chinese Office Action, with English translation, issued in Chinese application 200910225092.2 dated Mar. 19, 2012.

(Continued)

*Primary Examiner* — Victor A Mandala
(74) *Attorney, Agent, or Firm* — McDermott Will & Emery LLP

(57) ABSTRACT

There is provided a light emitting diode package, including a package body including a recess portion having a housing space and a lead frame mounted on the recess portion to be exposed; a light emitting diode chip mounted to be electrically connected to the lead frame; and a position indicator formed on the lead frame and guiding the mounting position of the light emitting diode chip.

7 Claims, 4 Drawing Sheets

OTHER PUBLICATIONS

Chinese Office Action, and English translation thereof, issued in Chinese Patent Application No. 200910225092.2 dated Sep. 10, 2012.

Japanese Patent Court Decision issued on Dec. 18, 2012 in corresponding Japanese Patent Application No. 2009-265667.

Decision of Rejection from the Chinese State Intellectual Property Office issued Dec. 5, 2012 in Chinese Patent Application No. 200910225092.2 with English Translation.

* cited by examiner

LIGHT EMITTING DIODE PACKAGE

CROSS-REFERENCE TO RELATED APPLICATIONS

This application claims the priority of Korean Patent Application No. 10-2009-0035703 filed on Apr. 23, 2009, in the Korean Intellectual Property Office, the disclosure of which is incorporated herein by reference.

BACKGROUND OF THE INVENTION

1. Field of the Invention

The present invention relates to a light emitting diode package, and more particularly, to a light emitting diode package having an improved brightness level by optimizing the mounting position of a light emitting diode chip.

2. Description of the Related Art

With the rapid development of the consumer electronics industry, various display devices having a smaller size and lower energy consumption continue to be developed. By the use of such display devices, optical devices provided in video devices, computers, mobile communication terminals, flashes, and the like, are being developed.

In general, a light emitting diode (LED) is an electronic component that makes charge-carriers (electrons or holes) by the use of pn junctions, recombines them, converts electrical energy into light energy, and emits light.

That is, when a forward voltage is applied to a semiconductor, electrons and holes flow through the junction of an anode and a cathode and they are recombined. A lower energy level is present when an electron meets a hole, relative to when the electron is apart from the hole. At this time, due to an energy gap, light is emitted to the outside.

Light emitted from LEDs ranges from red (630 nm to 780 nm) to blue-ultra violet (350 nm) and may include blue, green, and white. LEDs present many advantages over traditional light sources such as incandescent lamps and fluorescent lamps, including lower power consumption, high efficiency, longer lifetimes, and the like, so the demand for LEDs is continuously increasing.

Currently, LED applications are gradually being extended from small lighting devices for cellular phones, PDA displays, and the like, to indoor or outdoor lighting devices, automotive lighting devices, backlights for large LCDs, and the like.

In the case of an LED package to which an LED is electrically connected, since an operator only checks the mounting position of the LED roughly when mounting the LED on a lead frame by die bonding, it is difficult to mount it on the exact position intended.

Such slight deviations in the LED mounting position prevent the optimization of the LED's brightness in the LED package and increase variations in brightness levels according to LED package.

Also, positional variations in wire bonding in the LED package cause poor contact, due to the deviations in the LED mounting position as described above, and lead to economic losses. Therefore, there is a need for techniques with which to address such defects.

SUMMARY OF THE INVENTION

An aspect of the present invention provides a light emitting diode (LED) package capable of reducing variations in brightness levels and preventing poor contact in wire bonding.

According to an aspect of the present invention, there is provided an LED package, including: a package body including a recess portion having a housing space and a lead frame mounted on the recess portion to be exposed; an LED chip mounted to be electrically connected to the lead frame; and a position indicator formed on the lead frame and guiding the mounting position of the LED chip.

The position indicator may include patterns formed to be indented inward on the lead frame.

The position indicator may be formed to be spaced about 200 μm to 270 μm apart from a side of the recess portion in a width direction thereof.

The position indicator may include a first pattern formed to be spaced about 200 μm to 270 μm apart from a side of the recess portion in a width direction thereof, and a second pattern formed to be spaced about 600 μm to 700 μm apart from the first pattern.

The position indicator may include a first pattern formed to be spaced about 200 μm to 270 μm apart from a side of the recess portion in a width direction thereof, and a second pattern formed to be spaced about 50 μm to 100 μm apart from a side of the recess portion in a length direction thereof.

The position indicator may include a first pattern formed to be spaced about 200 μm to 270 μm apart from a side of the recess portion in a width direction thereof and spaced about 50 μm to 100 μm apart from a side of the recess portion in a length direction thereof, a second pattern formed to be horizontally disposed about 600 μm to 700 μm from the first pattern in a length direction thereof, a third pattern formed to be horizontally disposed about 200 μm to 250 μm from the first pattern in a width direction thereof, and a fourth pattern formed to be horizontally disposed about 600 μm to 700 μm from the third pattern in a length direction thereof.

The light emitting diode package may further include a zener mounted on the lead frame and preventing static electricity.

The position indicator may include a zener indicating pattern formed on the lead frame and guiding a mounting position of the zener.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

The invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
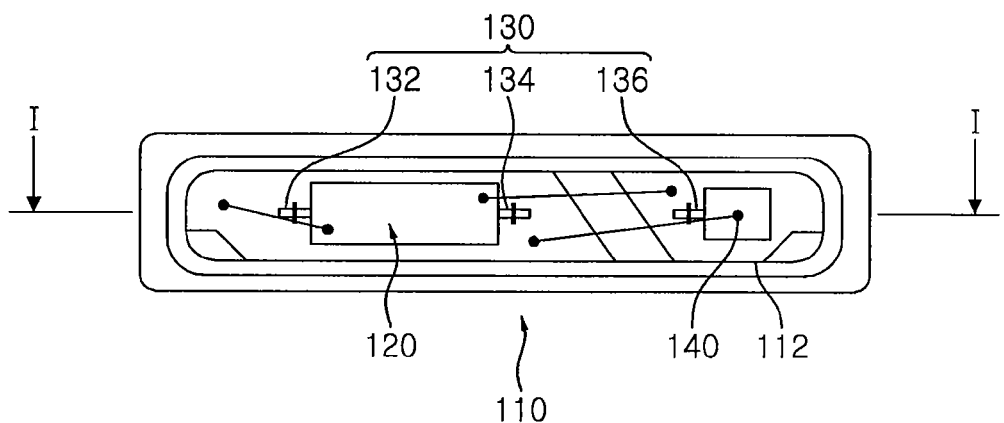
FIG. 1 is a top view illustrating a light emitting diode (LED) package according to an exemplary embodiment of the present invention.
Figure 2:
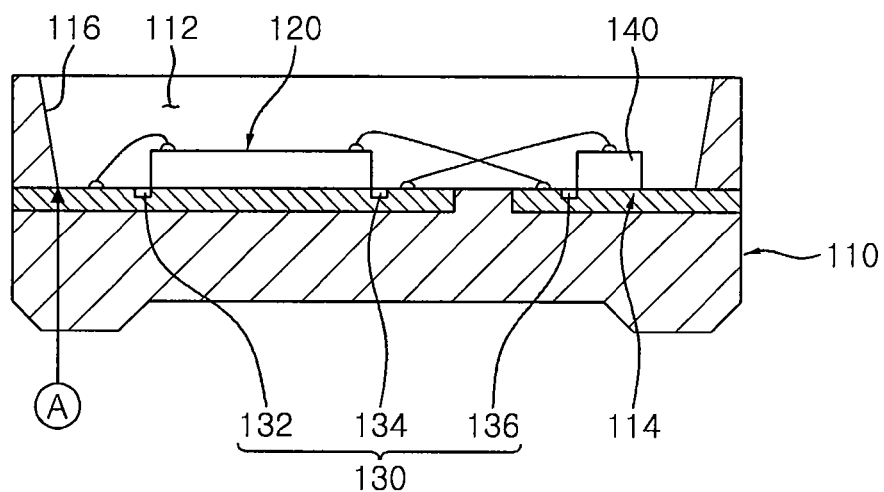
FIG. 2 is a cross-sectional view of the LED package which is divided along a section I-I in FIG. 1.
Figure 3:
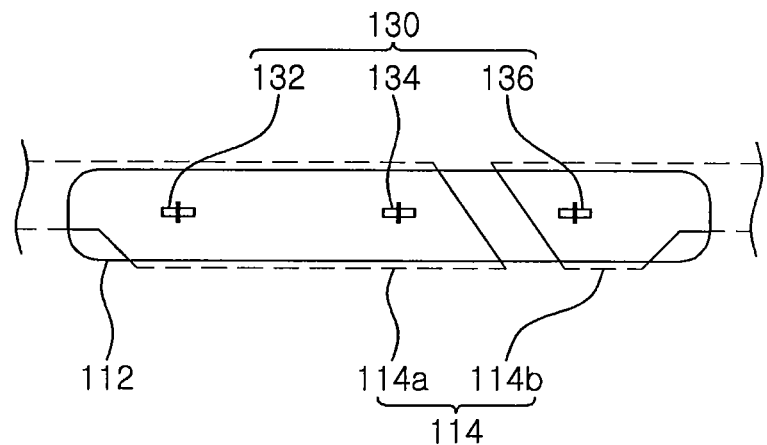
FIG. 3 is a schematic front view illustrating a lead frame in the LED package of FIG. 1.

FIG. 1 is a top view illustrating a light emitting diode (LED) package according to an exemplary embodiment of the present invention. FIG. 2 is a cross-sectional view of the LED package which is divided along a section I-I in FIG. 1. FIG. 3 is a schematic front view illustrating a lead frame in the LED package of FIG. 1.

Referring to FIGS. 1 through 3, an LED package (100) includes a package body 110, an LED chip 120, and a position indicator 130.

The package body 110 includes a recess portion 112 having a housing area and a lead frame 114 mounted on the recess portion 112 to be exposed.

Also, the package body 110 may be a resin structure employing an injection molding technique with resin materials, in which the LED chip 120 is mounted on an electrode provided as the lead frame 114 that is mounted on the recess portion 112 to be exposed to the outside. The package body 110 may be formed to surround the LED chip 120.

In this embodiment, the package body 110 may be a structure in the form of a side view type. However, the package body 110 is not limited thereto. It may also be a structure in the form of a top view type.

Here, the side view type defines the structure of a package body in which an LED is mounted on the side of a light guide plate. In that structure, the LED is disposed such that the light generated from the LED can be emitted onto a substrate.

The top view type defines the structure of a package body in which a plurality of lamps are disposed at the bottom of a light diffuser plate such that light can be emitted forward to a substrate.

The package body 110 has the recess portion 112 formed to be an open space thereof. The recess portion 112 may further include a reflection portion 116 on the inner side of the recess portion 112 to reflect the light generated by the LED chip 120. This reflection portion 116 may be provided by coating or depositing reflective materials on the entirety of the inclined inner surface of the recess portion 112. The reflective materials may be formed of one of Al, Ag, Pt, Ti, Cr and Cu, which have high rates of reflectivity.

However, the reflection portion 116 is not limited thereto. It may be provided by bonding a separate board formed of one of Al, Ag, Pt, Ti, Cr and Cu, which have high rates of reflectivity.

Also, the package body 110 may further have a lens on the top thereof so as to widen the orientation angle of the light generated by the LED chip 120 or enhance light efficiency. The recess portion 112, covered by the lens, may be filled with a filler formed of a transparent resin material so as to protect the LED chip 120 and a metal wire from the external environment.

The lead frame 114 may be integrally fixed to the inside of the package body 110 and extended to the outside of the package body 110 to expose the end of the lead frame 114, thereby naturally forming an external electrode terminal.

Here, the lead frame 114 may be made of metallic materials and electrically connected to the LED chip 120. It supplies external power source to the LED package 100.

Specifically, the lead frame 114 is configured of a cathode lead 114a and an anode lead 114b that are connected to the external power source. The cathode lead 114a or the anode lead 114b is bonded to the LED chip 120 mounted thereon by the use of die bonding. At this time, the LED chip 120 is mounted between a first pattern 132 and a second pattern 134 after verifying the position of the position indicator 130.

The LED chip 120 may be mounted at the bottom of the recess portion 112. The LED chip 120 is able to emit light in a variety of colors.

Also, the LED chip 120 is able to present distinct colors according to material characteristics, for example, blue, green, red, yellow, and orange. The colors of light emitted by the LED chip 120 can be properly selected by those skilled in the art.

Specifically, the LED chip 120 may emit colorless ultraviolet light. Since the light emitted by an ultraviolet LED is colorless, the ultraviolet LED may use phosphors to emit colored light, especially white light LEDs which are readily commercially available.

The LED chip 120 used in the embodiment of the present invention may be selected from GaP-based, GaPAsP-based, GaAs-based, GaAlAs-based, InGaAlP-based, GaN-based, and SiC-based diodes. However, the LED chip 120 is not limited thereto.

The position indicator 130 may be formed on the lead frame 114. As illustrated in FIGS. 1 through 3, the position indicator 130 may be formed to correspond to the mounting position of the LED chip 120.

Here, as illustrated in FIG. 2, the position indicator 130 may include patterns that are formed to be recessed downward. Such a form may be manufactured by inserting a mold pattern inward from the surface of the lead frame 114 on the top of the lead frame 114.

However, the position indicator 130 is not limited thereto. It may be realized in a variety of manners. For example, the position indicator 130 may not only be formed to be indented downward on the lead frame 114, but also be formed to be protruded upward on the lead frame 114.

Also, the position indicator 130 may indicate the mounting position of the LED chip 120 by the use of an indicator recognizable to the operator's eyes.

Figure 4:
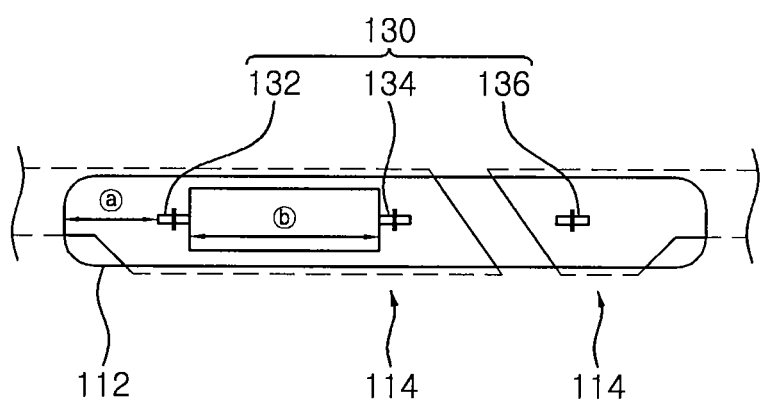
FIG. 4 is a schematic front view illustrating a position indicator in an LED package according to an exemplary embodiment of the present invention.

FIG. 4 is a schematic front view illustrating a position indicator in an LED package according to an exemplary embodiment of the present invention.

Referring to FIG. 4, the position indicator 130 includes the first pattern 132 formed to be spaced about 200 µm to 270 µm apart from the side of the recess portion 112, the second pattern 134 formed to be spaced about 600 µm to 700 µm apart from the first pattern 132, and a zener indicating pattern 136 guiding the mounting position of a zener 140.

The recess portion 112 defines an inner space whose top is open so as to mount the LED chip 120. The side of the recess portion 112 is a sidewall of the open-topped space, which is illustrated as A in FIG. 2.

Here, the zener 140 may be electrically connected to the lead frame 114 to prevent static electricity and mounted on one electrode of the lead frame 114 as opposed to the other electrode of the lead frame 114 having the LED chip 120 mounted thereupon.

The first pattern 132, the second pattern 134, and the zener indicating pattern 136 may be disposed in a straight line and all three elements may be connected to the top of the lead frame 114 by wire bonding.

However, the number of the position indicators 130 is not limited thereto. According to a designer's intention, a plurality of position indicators may be provided, or only one position indicator may be provided to indicate the mounting position of the LED chip 120.

In this embodiment, the LED chip 120 may be mounted between the first pattern 132 and the second pattern 134. Such a mounting position between the first pattern 132 and the second pattern 134 may be understood to be the most optimal position in which to greatly optimize the brightness level of the LED chip 120.

Since the first pattern 132 and the second pattern 134 are formed on the lead frame 114, the operator is able to accurately mount the LED chip 120 in a position optimizing the brightness levels of the LED chip 120. This prevents an undesirable situation, wherein the operator merely checks the mounting position roughly, thereby causing a relatively high variation in the brightness levels of LED packages.

TABLE 1

| Level | StDev |
| --- | --- |
| IV_old | 0.0610 |
| IV_new | 0.0452 |

The above Table 1 defines data values numerically expressed so as to verify the existence and nonexistence of a significant difference by the use of samples of an earlier produced LED package (IV_old) and a LED package produced to have the position indicator 130 according to the embodiment of the present invention (IV_new).

Here, when the data value of the significant difference (StDev) is below 0.05, it indicates the existence of the significant difference. Since the LED package according to the embodiment of the present invention includes the position indicator 130, it allowed the LED chip 120 to be mounted in a position optimizing the brightness level, thereby proving that such an effect can be obtained by the position indicator 130.

Figure 5:
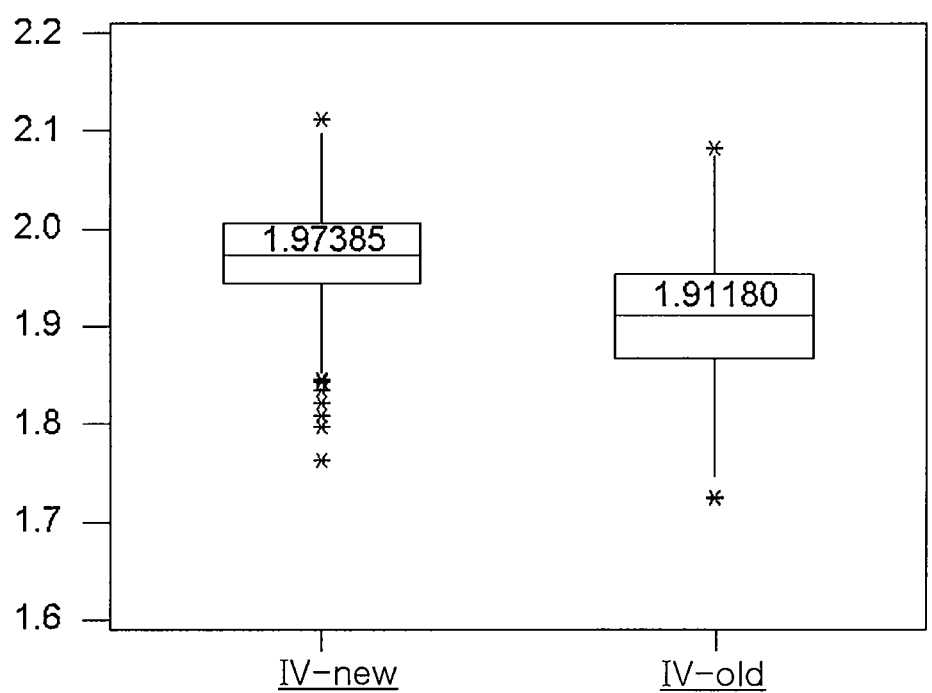
FIG. 5 is a graph illustrating the experimental values of measuring the brightness level of an LED package according to an exemplary embodiment of the present invention.

FIG. 5 is a graph illustrating the experimental values of measuring the brightness level of an LED package according to an exemplary embodiment of the present invention.

Referring to FIG. 5, the brightness level of an earlier produced LED package is approximately 1.91180 cd, and that of an LED package in which the LED chip 120 was mounted by the use of the position indicator 130 according to the embodiment of the present invention is approximately 1.97385 cd.

These experimental values show that the brightness level of the LED package according to the embodiment of the present invention increases by more than 50 mcd relative to the earlier produced LED package. With the experimental data obtained by the use of samples, it is easily proved that the LED package according to the embodiment of the present invention has a notably enhanced brightness level relative to the earlier produced LED package.

As a result, since the LED chip 120 can be mounted in the exact position to optimize its brightness level, there are advantages that the LED chip 120 can have a considerably enhanced brightness level relative to the earlier LED chip having a relatively high deviation in the mounting position of the LED chip, and large variations in the brightness levels of each product can be prevented.

Also, the LED package according to the embodiment of the present invention places the LED chip 120 in the exact position, thereby preventing poor contact during wire bonding. This results in an economic advantage due to the reduction in LED packages discarded due to such poor contact.

Figure 6:
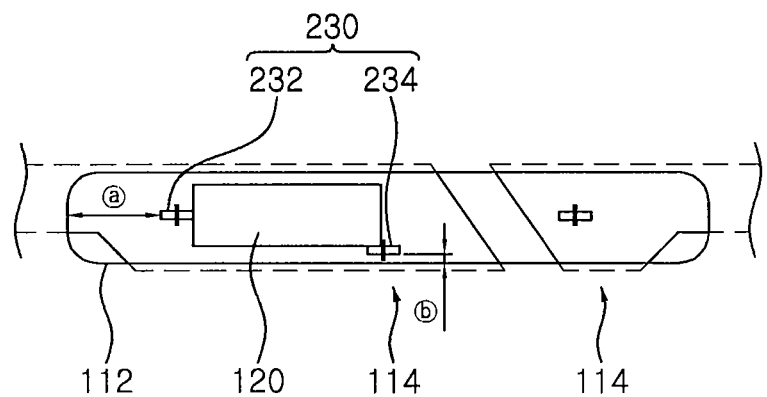
FIG. 6 is a schematic front view illustrating an LED package according to another embodiment of the present invention.

FIG. 6 is a schematic front view illustrating an LED package according to another embodiment of the present invention.

Referring to FIG. 6, an LED package includes a package body, an LED chip and a position indicator. The package body and the LED chip in this embodiment are substantially identical with those of the above-described embodiment, so their detailed descriptions may be omitted.

A position indicator 230 may include a first pattern 232 formed to be spaced about 200 μm to 270 μm apart from the side of the recess portion 112 in the width direction thereof and a second pattern 234 formed to be spaced about 50 μm to 100 μm apart from the side of the recess portion 112 in the length direction thereof.

The side of the recess portion 112 in the width direction thereof may be understood to be the shorter side of the square-shaped recess portion 112. The side of the recess portion 112 in the length direction thereof may be understood to be the longer side of the square-shaped recess portion 112.

As illustrated in FIG. 6, the first pattern 232 is spaced about 200 μm to 270 μm apart from the side of the recess portion 112 in the width direction thereof (ⓐ), and the second pattern 234 is spaced about 50 μm to 100 μm apart from the side of the recess portion 112 in the length direction thereof (ⓑ).

The first pattern 232 guides the side of the LED chip 120 in the width direction thereof, and the second pattern 234 guides the side of the LED chip 120 in the length direction thereof. Therefore, the operator is able to accurately verify the mounting position of the LED chip 120 using the first pattern 232 and the second pattern 234 and mount the LED chip 120 on the exact position of the lead frame 114 by die bonding, thereby obtaining the optimal brightness level and reducing the variations in the brightness levels of the LED chip 120.

Figure 7:
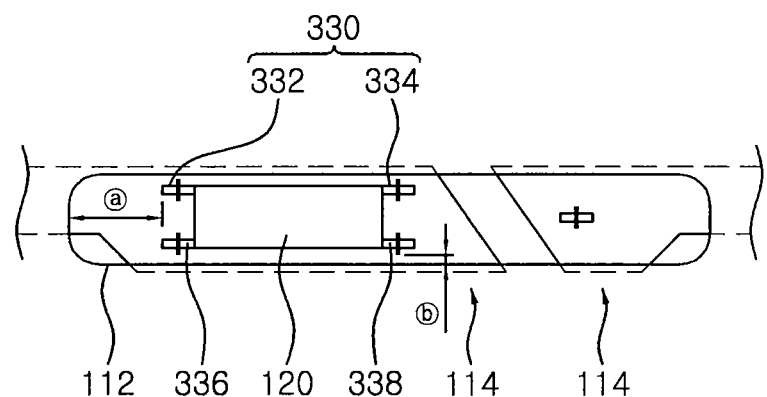
FIG. 7 is a schematic front view illustrating an LED package according to another embodiment of the present invention.

FIG. 7 is a schematic front view illustrating an LED package according to another embodiment of the present invention.

Referring to FIG. 7, an LED package includes a package body, an LED chip and a position indicator. The package body and the LED chip in this embodiment are substantially identical with those of the above-described embodiment, so their detailed descriptions may be omitted.

A position indicator 330 may include a first pattern 336 formed to be spaced about 200 μm to 270 μm apart from the side of the recess portion 112 in the width direction thereof and spaced about 50 μm to 100 μm apart from the side of the recess portion 112 in the length direction thereof, a second pattern 338 formed to be horizontally disposed about 600 μm to 700 μm from the first pattern 336 in the length direction thereof, a third pattern 332 formed to be horizontally disposed about 200 μm to 250 μm from the first pattern 336 in the width direction thereof, and a fourth pattern 334 formed to be horizontally disposed about 600 μm to 700 μm from the third pattern 332 in the length direction thereof.

The first pattern 336 guides the LED chip 120 to be disposed at one lower corner of the LED chip 120, and the second pattern 338 guides the LED chip 120 to be disposed at the opposed lower corner of the LED chip 120. The third pattern 332 guides the LED chip 120 to be disposed at one upper corner of the LED chip 120, and the fourth pattern 334 guides the LED chip 120 to be disposed at the opposed upper corner of the LED chip 120.

Since the mounting position of the LED chip 120 is guided by the first pattern 336, the second pattern 338, the third pattern 332, and the fourth pattern 334, the LED chip 120 can be mounted on the exact position of the lead frame 114 by die bonding. This allows the LED chip 120 to obtain its optimal brightness level and reduce the variations in brightness levels of the LED chip 120.

As set forth above, according to exemplary embodiments of the invention, the LED package includes the position indicator formed on the lead frame and allows the LED chip to be accurately mounted in the intended position of the lead frame by die bonding, thereby obtaining the optimal brightness level and reducing the variations in brightness levels of LED packages. Also, since the LED chip is disposed in the exact mounting position, the occurrence of poor contact during wire bonding can be prevented.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode package, comprising:
   a package body including a recess portion having a housing space and a lead frame mounted on a bottom surface of the recess portion to be exposed, the lead frame having a top surface and a bottom surface opposite to the top surface and facing the bottom surface of the recess portion;
   a light emitting diode chip mounted on the top surface of the lead frame to be electrically connected to the lead frame, such that a bottom surface of the light emitting diode chip faces the top surface of the lead frame, the top surface of the lead frame having a predetermined mounting area corresponding to the bottom surface of the light emitting diode chip; and
   a position indictor formed on the top surface of the lead frame at a mounting position on the circumference of the predetermined mounting area,
   wherein the position indicator is spaced apart from a side of the recess portion with a width length of about 200 µm to 270 µm.

2. The light emitting diode package of claim 1, wherein the position indicator comprises patterns formed to be indented inward on the lead frame.

3. The light emitting diode package of claim 1, wherein the position indicator comprises:
   a first pattern formed to be spaced about 200 µm to 270 µm apart from the side of the recess portion in a width direction thereof; and
   a second pattern formed to be spaced about 600 µm to 700 µm apart from the first pattern.

4. The light emitting diode package of claim 1, wherein the position indicator comprises:
   a first pattern formed to be spaced about 200 µm to 270 µm apart from the side of the recess portion in a width direction thereof; and
   a second pattern formed to be spaced about 50 µm to 100 µm apart from a side of the recess portion in a length direction thereof.

5. A light emitting diode package, comprising:
   a package body including a recess portion having a housing space and a lead frame mounted on a bottom surface of the recess portion to be exposed, the lead frame having a top surface and a bottom surface opposite to the top surface and facing the bottom surface of the recess portion;
   a light emitting diode chip mounted on the top surface of the lead frame to be electrically connected to the lead frame, such that a bottom surface of the light emitting diode chip faces the top surface of the lead frame, the top surface of the lead frame having a predetermined mounting area corresponding to the bottom surface of the light emitting diode chip; and
   a position indicator formed on the top surface of the lead frame at a mounting position on the circumference of the predetermined mounting area,
   wherein the position indicator comprises:
      a first pattern formed to be spaced about 200 µm to 270 µm apart from a side of the recess portion in a width direction thereof and spaced about 50 µm to 100 µm apart from a side of the recess portion in a length direction thereof;
      a second pattern formed to be horizontally disposed about 600 µm to 700 µm from the first pattern in a length direction thereof;
      a third pattern formed to be horizontally disposed about 200 µm to 250 µm from the first pattern in a width direction thereof; and
      a fourth pattern formed to be horizontally disposed about 600 µm to 700 µm from the third pattern in a length direction thereof.

6. The light emitting diode package of claim 1, further comprising: a zener mounted on the top surface of the lead frame and configured to prevent static electricity such that a bottom surface of the zener faces the top surface of the lead frame.

7. The light emitting diode package of claim 6, wherein:
   the top surface of the lead frame has a predetermined zener mounting area corresponding to the bottom surface of the zener, and
   the position indicator includes a zener indicating pattern formed on the top surface of the lead frame at a zener mounting position on the circumference of the predetermined zener mounting area.

* * * * *